United States Patent
Raghavan et al.

(10) Patent No.: US 12,387,796 B2
(45) Date of Patent: Aug. 12, 2025

(54) MEMORY ASSEMBLY WITH BODY BIASING AND RELATED METHODS

(71) Applicant: GlobalFoundries U.S. Inc., Malta, NY (US)

(72) Inventors: Ramesh Raghavan, Bengaluru (IN); Chandrahasa Reddy Dinnipati, Bangalore (IN); Philipp Bernhard Mosch, Ixelles (BE)

(73) Assignee: GlobalFoundries U.S. Inc., Malta, NY (US)

( * ) Notice: Subject to any disclaimer, the term of this patent is extended or adjusted under 35 U.S.C. 154(b) by 254 days.

(21) Appl. No.: 18/178,926

(22) Filed: Mar. 6, 2023

(65) Prior Publication Data
US 2024/0304258 A1  Sep. 12, 2024

(51) Int. Cl.
*G11C 5/14* (2006.01)
*G11C 16/26* (2006.01)
*G11C 16/34* (2006.01)

(52) U.S. Cl.
CPC .............. *G11C 16/26* (2013.01); *G11C 16/34* (2013.01); *G11C 5/14* (2013.01)

(58) Field of Classification Search
CPC ...................................... G11C 5/146
See application file for complete search history.

(56) References Cited

U.S. PATENT DOCUMENTS

| | | |
|---|---|---|
| 8,693,274 B2 | 4/2014 | Tran et al. |
| 10,381,069 B1 * | 8/2019 | Dhani Reddy .......... G11C 7/12 |
| 10,573,209 B2 | 2/2020 | Bi et al. |
| 11,056,208 B1 | 7/2021 | Jayaraman et al. |

FOREIGN PATENT DOCUMENTS

JP            6101198 B2     3/2017

OTHER PUBLICATIONS

Hunt-Schroeder et al., "Pre-Amplifier Based Entropy Source with Stable Output for use in a Physical Unclonable Function," 2021 IEEE Microelectronics Deign & Test Symposium (MDTS) 6 pages.

* cited by examiner

*Primary Examiner* — Jason Lappas
(74) *Attorney, Agent, or Firm* — David Cain; Hoffman Warnick LLC

(57) ABSTRACT

Embodiments of the disclosure provide a memory assembly with body biasing and related methods to operate such a structure. A structure according to the disclosure includes a memory cell having a pair of memory transistors each having a gate coupled to a word line. A pair of diode-connected transistors each have a source/drain (S/D) terminal coupled to a respective S/D terminal of one of the pair of memory transistors through a multiplexer. A bias voltage source is coupled to each body of the pair of diode-connected transistors or each body of the pair of memory transistors. The bias voltage source applies a different bias voltage to each body of the pair of diode-connected transistors or each body of the pair of memory transistors.

20 Claims, 7 Drawing Sheets

MEMORY ASSEMBLY WITH BODY BIASING AND RELATED METHODS

TECHNICAL FIELD

Embodiments of the disclosure relate generally to memory assemblies. More specifically, embodiments of the disclosure provide structures and methods to electrically bias the body terminals of memory cell transistors or diode-connected transistors of a sense amplifier, e.g., to filter unstable bits when reading data from a memory assembly.

BACKGROUND

The rise of networking devices, such as the "Internet of Things" (IoT), with links to a data center has expanded the need for reliable digital circuitry, particularly memory components on a chip, which may be required for seamless system operation. In conventional devices, sense amplifiers can amplify voltage levels stored within selected cells of a device to implement reading of data from a memory assembly where data is stored. In some cases, the individual cells of the memory assembly may have "unstable bits." In the case of a physically unclonable function (PUF), flash memory, or other types of memory structures, these unstable bits are not used for key generation and thus disregarded in memory storage and retrieval applications.

SUMMARY

All aspects, examples and features mentioned below can be combined in any technically possible way.

Aspects of the disclosure provide a structure including: a memory cell having a pair of memory transistors each having a gate coupled to a word line; a pair of diode-connected transistors each having a source/drain (S/D) terminal coupled to a respective S/D terminal of one of the pair of memory transistors through a multiplexer; and a bias voltage source coupled to each body of the pair of diode-connected transistors, wherein the bias voltage source applies a different bias voltage to each body of the pair of diode-connected transistors.

Further aspects of the disclosure provide a structure including: a memory cell having a pair of memory transistors each having a gate coupled to a word line; a pair of diode-connected transistors each having a source/drain (S/D) terminal coupled to a respective S/D terminal of one of the pair of memory transistors through a multiplexer; and a bias voltage source coupled to each body of the pair of memory transistors, wherein the bias voltage source applies a different bias voltage to each body of the pair of memory transistors.

Additional aspects of the disclosure provide a method including: coupling each of a pair of memory transistors of a memory cell to a respective one of a pair of diode-connected transistors through a multiplexer; applying a different bias voltage to each body of the pair of diode-connected transistors or the pair of memory transistors to adjust a threshold voltage margin of the pair of memory transistors; and applying a supply voltage to the pair of diode-connected transistors, while applying the different bias voltage, to read a stored bit from the pair of memory transistors and filter out lower memory cells having a threshold voltage margin lower than a minimum threshold voltage margin.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
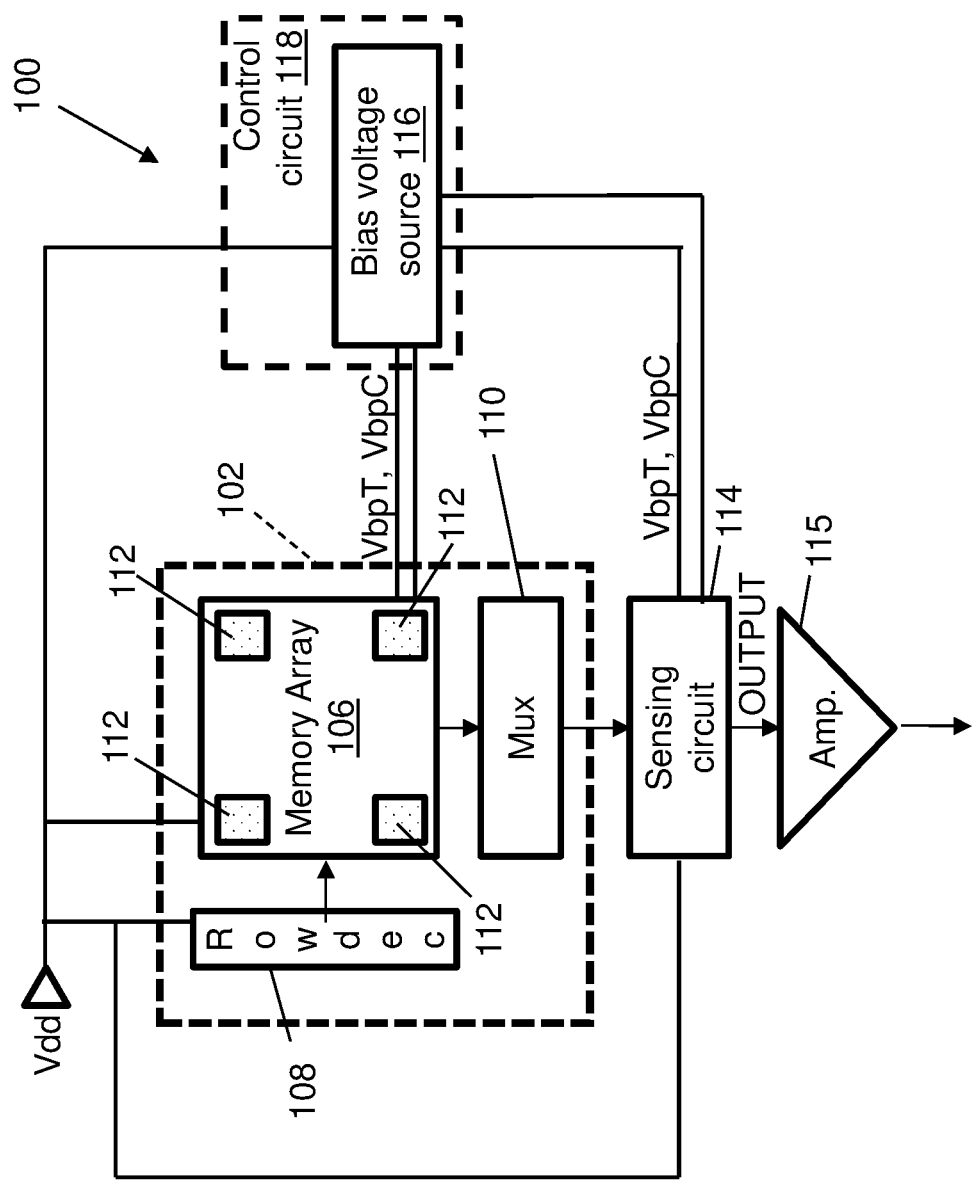
FIG. 1 shows a schematic view of a memory assembly, multiplexer, and sense amplifier according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure provide structures and related methods for a memory assembly with body biasing, e.g., to prevent unstable data bits from being read from memory. Under certain circumstances and/or after significant passage of time, bits stored in a digital memory may become unstable. That is, a single bit cell for recording a logic low or a logic high (expressed respectively, e.g., as a "zero" voltage or a "one" voltage) may not indicate the correct data value when it is read. In the case where a single bit cell outputs inconsistent logic levels without being rewritten, the bit cell is considered unstable. Unstable bits may significantly interfere with the functionality and reliability of a device, particularly where memory cells 112 (FIG. 1) are part of a memory used to drive the operation of critical device functions. Although external assemblies, devices, etc., may be connected to the bit cell(s) to monitor for instability, this arrangement is not preferable due to penalties imposed on chip surface area and/or power consumption. In some cases, e.g., in memory cells for implementing a physically unclonable function (PUF) having a unique data signature, the unstable bits may arise from inherent properties of the memory assembly and may be unnecessary to provide the data signature. Embodiments of the disclosure provide a structure and method to modify the threshold voltage of transistors in a memory cell, thus offsetting a detected threshold voltage margin between the two transistors by a desired amount. Among other benefits, embodiments of the disclosure improve readability of stable memory cells and prevent memory cells with unstable data bits from being read.

An apparatus according to the disclosure may include a memory cell having a pair of memory transistors. The memory transistors may have complementary polarities i.e., they may include a P-type field effect transistor ("PFET") coupled at its gate to the gate of an N-type field effect transistor ("NFET") through a word line. A pair of diode-connected transistors (i.e., transistors having a gate terminal coupled to the source or drain of the same transistor without additional circuitry therebetween) each may be coupled to a source or drain terminal of one of the memory transistors in the memory cell. A multiplexer may be electrically between the memory cell and the pair diode-connected transistors, e.g., to select which cell(s) is/are being written and read during operation. The diode-connected transistors may be part of a sensing circuit (including, e.g., one or more amplifiers, also known in the art as "sense amps") for reading a memory assembly having several individual memory cells. Each diode-connected transistor can connect a voltage supply (typically represented in circuit schematics as "Vdd") to one of the pair of memory transistors in the memory cell via the multiplexer.

A bias voltage source (e.g., logic or other circuitry for converting the voltage from the voltage supply into a smaller-magnitude voltage) may be coupled to each body terminal of the pair of diode-connected transistors, or alternatively, each body terminal of the pair of memory transistors in the memory cell. In either case, the bias voltage source will modify the threshold voltage of the transistors to which it connects. Modifying the threshold voltage of the pair of diode-connected transistors, and/or the pair of memory transistors of the memory cell, will affect the detectable voltages within each memory cell. Specifically, unstable data bits for a PUF structure are not used for key generation whereas stable data bits will be used for key generation. Similarly, if the sensing circuit is used for different memory structures and/or applications, the unstable bits or weak bits will not be used for bit storage whereas stable bits can be used for bit storage. Related methods according to the disclosure include performing a read operation while applying a body bias to the transistors of the memory cell or the diode-connected transistors.

Referring to FIG. 1, a schematic view of a structure 100 including a memory assembly 102 and interconnected components according to embodiments of the disclosure is shown. Memory assembly 102 may include any currently known or later developed memory device suitable for use in an integrated circuit (IC), and may include, for example, a physically unclonable function (PUF) for generating a unique digital signature as a readable digital word, a flash memory component for storing data within a transistor having a stack of floating and control gates, and/or any other currently known or later developed component for reading stored data. Memory assembly 102 as an example may include a memory array (simply "array" hereafter) 106 having multiple memory cells 112 to electrically store individual bits. As discussed further herein, array 106 may store data in the form of high and low voltages, respectively, indicating one of a high logic level or a low logic level. As examples, array 106 may include various forms of non-volatile memory ("NVM"), i.e., memory that retains the data stored therein when a device is powered off. A PUF is a type of NVM that may be implemented on memory assembly 102. In this case, memory assembly 102 may be an electrically active structure (e.g., a set of diodes, transistors, etc.) capable of generating a unique electrical response in response to a predetermined electrical input. The array of components may be implemented or modeled as transistors outputting high or low voltages in response to the predetermined electrical input. In another example, array 106 may be implemented as flash memory. Flash memory is a type of NVM having an array of transistors, each of which may have two gates thereon. A control gate may be used to read or write data from a respective transistor, whereas a floating gate beneath the control gate may store a voltage to record a "high" or "one" bit in memory. Although other circuitry and/or devices coupled to memory assembly 102 may write data to array 106 via any of several approaches to store data in a circuit, embodiments of the disclosure are concerned with reading and processing data that is already stored in memory assembly 102. Since operations for writing data to memory assembly 102 are well understood in the art, such operations are not disclosed in further detail.

As noted herein, embodiments of the disclosure may be particularly suitable to memory assemblies 102 and/or memory arrays 106 embodied using a physically unclonable function (PUF) architecture. A physically unclonable function, also known as a "physical unclonable function" may refer to any physical object that for a particular set of inputs may provide a corresponding, physically defined output capable of uniquely identifying the PUF object. The input to the PUF may be known as a "challenge," and the output from the PUF may be referred to as the "response" or "response to challenge." PUFs may be implemented by way of integrated circuits, including static random access memory (SRAM) structures or other types of circuits having transistors capable of body biasing, as well as other appropriate components such as vias, metal contacts, radio frequency (RF) components, optical circuitry, etc. It is understood that embodiments of structure 100 described herein do not depend on the type of memory assembly 102 and/or memory arrays 106 from which data is read and may be implemented substantially similarly regardless of the mechanism(s) for storing or retrieving data in memory assembly 102 and/or memory arrays 106.

To read data from array 106, memory assembly 102 may include a row decoder (sometimes labeled "rowdec") 108 for electrically driving a portion of array 106, and a multiplexer (also known as a "column multiplexer" and labeled "mux") 110 for selecting a memory cell 112 to be read from the electrically driven portion of array 106. Each memory cell 112 includes a pair of memory transistors 120 (FIG. 2) which record a single bit of data (i.e., a high or low voltage indicating a high or low logic level) in array 106. Row decoder 108 may selectively transmit a driving signal to one row of memory cells 112 via a word line driver coupled to a respective bit line in memory array 106. Thus, row decoder 108 may select a row of memory cells 112 as a subset of data entries and send a signal to one row of memory cells 112.

This operation allows reading of the selected cells during a read operation. While being driven via row decoder 108, the selected bit cell(s) 112 are considered to be electrically active. While row decoder 108 selectively drives a row of memory cells 112, multiplexer 110 may select one column to access the data in one memory cell 112 of the electrically active row. Multiplexer 110 may transmit a signal to structure 100, which may include a voltage indicative of the memory state in memory cell 112 when it is read. Row decoder 108 and column multiplexer 110 may cooperate to access one memory cell 112, thereby outputting a high voltage or low voltage to structure 100 representing whether memory cell 112 has a logic high or logic low value stored therein at a given instance in time. As will be discussed in further detail herein, structure 100 may include additional circuitry to electrically bias memory to filter unstable data (i.e., prevent it from being read) and simultaneously improve the readability of stable data within memory array 106.

Figure 2:
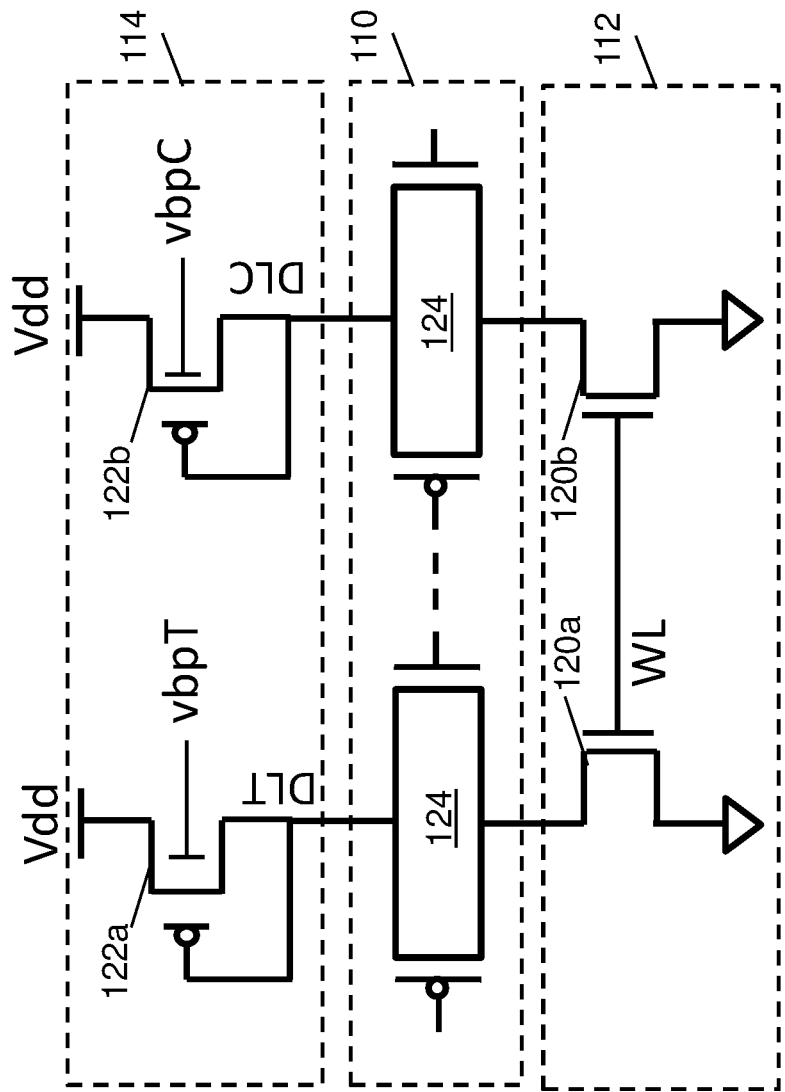
FIG. 2 shows an expanded schematic view of a structure according to embodiments of the disclosure.

Structure 100 includes a sensing circuit 114 (also known as a "sense amplifier") coupled to memory assembly 102 to receive signals indicating the memory state of bit cell(s) 112 being read. Sensing circuit 114 may include various sub-components for detecting and/or processing such signals, e.g., a pair of diode-connected transistors 122 (FIG. 2). Such components may amplify and enable interpreting of voltage levels output from memory assembly 102. However embodied, sensing circuit 114 may include any component and/or combination of components for generating an output signal ("OUTPUT"), which may be a single output signal or a set of parallel output signals corresponding to different memory cells 112. The output from sensing circuit 114 thus may detect a first voltage of memory cell 112 indicating a memory state (i.e., high or low logic level) at a given instance, and another memory state of memory cell 112 at a second instance (i.e., high or low logic level at a second pulse). Although sensing circuit 114 is illustrated as part of structure 100, sensing circuit 114 or portions thereof may be structurally integrated into and/or otherwise coupled directly to portions of memory assembly 102.

In an example implementation, sensing circuit 114 may include or be coupled to an amplifier 115 configured to sense the low amplitude power signals representing a data bit in memory array 106, and amplify it to higher voltage logic levels capable of being processed and interpreted by other circuitry. In an example implementation, amplifier 115 may be electrically integrated into sensing circuit 114 rather than being a separate component. In any case, amplifier 115 may include several transistors (e.g., typically four but sometimes as few as two or as many as thirteen transistors) for converting the output from sensing circuit 114 into a signal indicating the memory state of a selected memory cell 112.

Structure 100 additionally may include a bias voltage source 116, e.g., a voltage divider including serially interconnected resistors (or similar electrical elements for reducing voltage, e.g., memristors, potentiometers, etc.) coupling supply voltage Vdd to memory array 106 and/or sensing circuit 114. Bias voltage source 116 can be configured to convert the voltage magnitude of supply voltage Vdd into lower magnitude biasing voltages VbpT, VbpC to be applied to one or both of memory array 106 and/or sensing circuit 114. More specifically, bias voltage source 116 may be configured to electrically bias the body terminals of a pair of memory transistors 120 within memory cell(s) 112 of memory array 106, and/or a pair of diode-connected transistors within sensing circuit 114. The term "body terminal," as used herein, may refer collectively to the semiconductor body of a planar complementary metal oxide semiconductor (CMOS) transistor on a bulk semiconductor, the back gate terminal of semiconductor on insulator (SOI) transistor, or equivalent terminal configured for adjusting the threshold voltage of a transistor through electrical biasing thereof. The electrical connection from bias voltage source 116 to memory cell(s) 112 and sensing circuit 114 is depicted as a double line because bias voltage source 116 may include a voltage inverter and/or other components to transmit distinct, opposite polarity biasing voltages. The bias voltages are indicated as VbpT to denote a first polarity ("true") voltage bias and VbpC to denote the opposite polarity ("complementary") voltage bias. Each of the two voltage biases may be connected to one of a pair of transistors within memory cell 112 and/or sensing circuit 114, even where the two transistors are not themselves of opposite polarity. As will be discussed herein, sensing circuit 114 may include two diode-connected transistors 122 (FIG. 2 et seq.) on "true" and "complementary" data lines, but the transistors themselves may not be of opposite polarity.

Bias voltage source 116 optionally may be included within a control circuit 118, e.g., for adjusting the magnitude of biasing voltage(s) VbpT, VbpC applied to memory cell(s) 112 and/or sensing circuit(s) 114. Control circuit 118 may include hardware in the form of circuitry and/or logic for adjusting a voltage bias applied to memory cell(s) 112 and/or sensing circuit 114, and/or may include a computing device and software thereon for adjusting the voltage bias applied via bias voltage source 116. Control circuit 118 may adjust the magnitude of biasing voltages VbpT, VbpC to control a detectable voltage boundary in each memory cell 112 of memory array 106. Control circuit 118 may perform this function regardless of whether control circuit 118 applies biasing voltages VbpT, VbpC to memory cells 112, sensing circuit 114, or both of cells 112 and sensing circuit 114. Control circuit 118 thus may be operable to define which memory cells 112 within memory array 106 will be detected during a read operation, e.g., by selecting a threshold voltage for each transistor which filters out pairs of memory transistors having a lower threshold voltage margin. The term "threshold voltage margin" refers to the difference in threshold voltage between each transistor of a pair. In a simplified example, a first transistor having a threshold voltage of 100 millivolts (mV) and a second transistor having a threshold voltage of 150 mV would have a threshold voltage margin of 50 mV.

Turning to FIG. 2, an expanded schematic diagram of multiplexer 110, memory cell 112, and sensing circuit 114 is shown according to embodiments of the disclosure. In this example, sensing circuit 114 receives biasing voltages VbpT, VbpC whereas memory cell 112 does not receive biasing voltages VbpT, VbpC. Memory cell 112 may include a set of memory transistors 120 (separately labeled 120a, 120b for reference). Transistor 120a may have a first polarity (e.g., it may be a pFET) whereas transistor 120b may have the opposite polarity (e.g., it may be an nFET). Transistors 120a, 120b may be connected to each other at their gates through a word line (WL) configured for implementing a read operation on memory cell 112. That is, a high voltage in word line WL may select memory transistors 120a, 120b for reading, whereas a low voltage in word line WL may be less than the threshold voltage of each transistor 120a, 120b and thus may prevent data in memory transistors 120a, 120b from being read.

A set of data lines including a data line true (DLT) and a data line complementary (DLC) may couple a source/drain (S/D) of each memory transistor 120a, 120b to one of two diode-connected transistors 122a, 122b in sensing circuit 114 through multiplexer 110. Multiplexer 110 may include a set of column connections 124 that are electrically between memory cell 112 and sensing circuit 114 to further control whether data can be read from memory cell 112. For instance, word line WL may control whether all memory cells 112 in a single row of memory array 106 (FIG. 1) have a voltage applied thereto. To read data from only selected memory cells 112 in a given row, multiplexer 110 may activate only selected column connections 124 to electrically couple the S/D terminals of one or more selected memory cells 112 to sensing circuit 114.

Sensing circuit 114 may include a pair of diode-connected transistors 122, separately identified as "122a" to indicate being coupled to data line true DLT and "122b" to indicate being coupled to data line complementary DLC. Despite being coupled to opposite polarity data couplings, diode-connected transistors 122 may be of the same polarity. A "diode-connected transistor" refers to a transistor in which the gate and drain are connected to each other, thus causing the transistor to act as a short circuit between source and drain (i.e., the transistor is saturated in the case of planar device). Diode-connected transistors 122a, 122b of sensing circuit 114 may serve to amplify signals transmitted from memory cell 112. Furthermore, each diode-connected transistor 122a, 122b may provide filtration by not transmitting any voltage levels that are less than its threshold voltage.

As noted elsewhere herein, bias voltage source 116 (FIG. 1) may apply a set of voltage biases VbpT, VbpC to the body terminals of each diode-connected transistor 122a, 122b. Bias voltage source 116 may be configured to apply distinct voltage biases to each diode-connected transistors 122a, 122b. The distinct voltage biases may affect a threshold voltage margin between diode-connected transistors 122a, 122b, i.e., they may affect the difference in voltage for operating one diode-connected transistor (e.g., transistor 122a) relative to the other (e.g., transistor 122b). The magnitude of the threshold voltage margin is controllable, e.g., by adjusting the voltage output(s) from bias voltage source 116 directly, or by using control circuit 118 (FIG. 1) to apply desired voltage magnitudes to each diode-connected transistor 122a, 122b. Biasing voltages VbpT, VbpC may affect diode-connected transistors 122a, 122b solely by increasing or reducing their threshold voltage. Biasing voltages VbpT, VbpC otherwise may have no effect on the operational features of memory cell(s) 112 (i.e., storing and retrieving data) or sensing circuit 114 (i.e., amplifying of stored voltages for interpretation). However selected, biasing voltage VbpT, VbpC may be controlled to filter out lower threshold voltage margin pairs of transistors, i.e., they may prevent some memory cells 112 within memory array 106 from being read.

Embodiments of the disclosure are operable to prevent sensing circuit 114 from filtering out "lower threshold voltage margin pairs" of memory transistors 120 in structure 100 from being read. Each pair of memory transistors 120 in structure 100 may be considered to be a "higher threshold voltage margin pair," i.e., having a threshold voltage margin that is high enough to determine the memory state in memory cell 112, or is otherwise a "lower threshold voltage margin pair," i.e., having a threshold voltage margin that is too low to determine the memory state in memory cell 112. The minimum threshold voltage margin sufficient to determine the memory state may vary between applications, types of memory arrays 106, etc. Control circuit 118 (FIG. 1) in some implementations is operable to detect the minimum threshold voltage margin for determining the memory state in memory array 106, and may select and apply biasing voltages VbpT, VbpC to prevent sensing circuit 114 from reading data from any memory cells 112 that have a lower threshold voltage margin pair of memory transistors 120.

Figure 3:
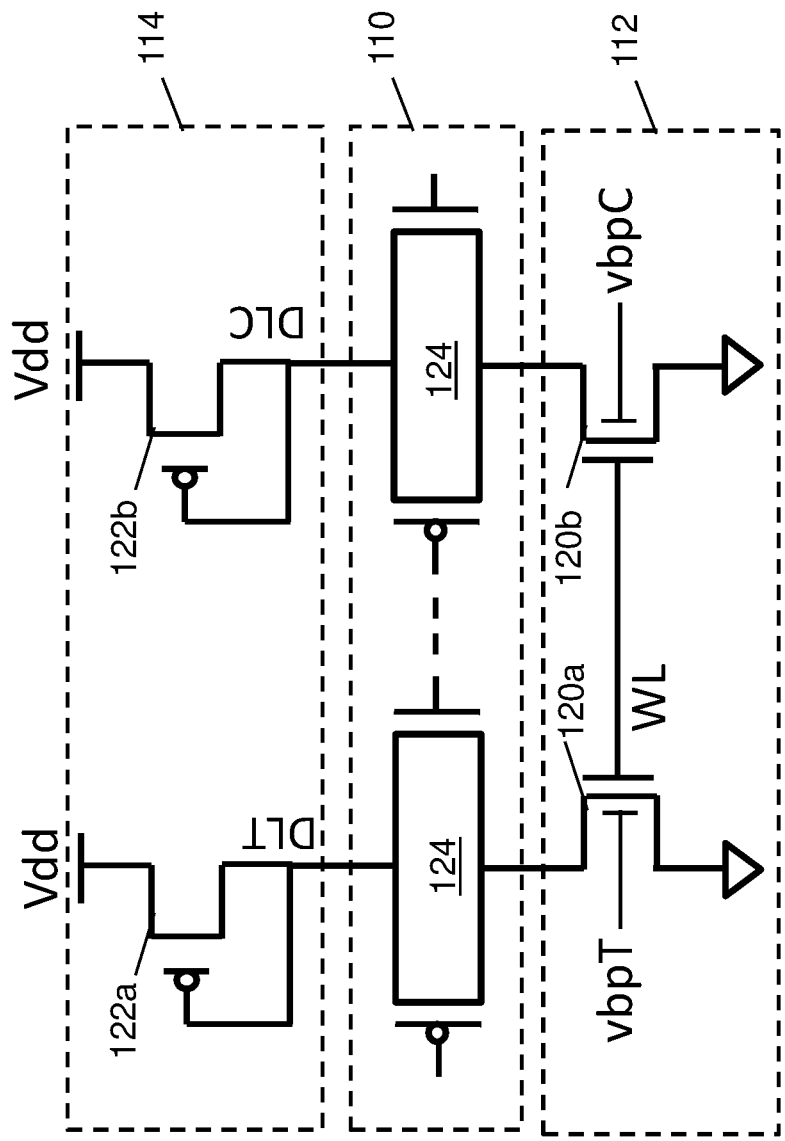
FIG. 3 shows an expanded schematic view of a structure according to further embodiments of the disclosure.

FIG. 3 depicts a further implementation of memory cell 112 and sensing circuit 114 coupled thereto. In contrast to other implementations discussed herein, bias voltage source 116 (FIG. 1) may apply biasing voltages VbpT, VbpC to the body terminals of memory transistors 120a, 120b instead of diode-connected transistors 122a, 122b. In this case, biasing voltage source 116 will directly adjust the threshold voltage margin of memory transistors 120a, 120b, e.g., by applying different bias voltages to the body of each memory transistor 120a, 120b. This approach contrasts with the biasing of diode-connected transistors 122a, 122b, e.g., because body biasing of diode-connected transistors 122a, 122b affects whether sensing circuit 114 will read unstable bits from memory cell 112, as compared to directly affecting the threshold voltage margin within memory cell 112. The operational effect of biasing voltages VbpT and VbpC thus may be identical to other embodiments discussed herein, even though memory transistors 120a, 120b are being biased instead of diode-connected transistors 122a, 122b. That is, bias voltage source 116 applies biasing voltages VbpT, VbpC to directly control the minimum voltage margin needed for sensing circuit 114 to read memory cell 112. The amount of biasing to memory transistors 120a, 120b may be controlled such that biasing voltage source 116 filters out lower margin threshold voltage margin pairs of memory transistors 120a, 120b, thus enabling only higher threshold voltage margin pairs of memory transistors 120a, 120b to be read.

Figure 4:
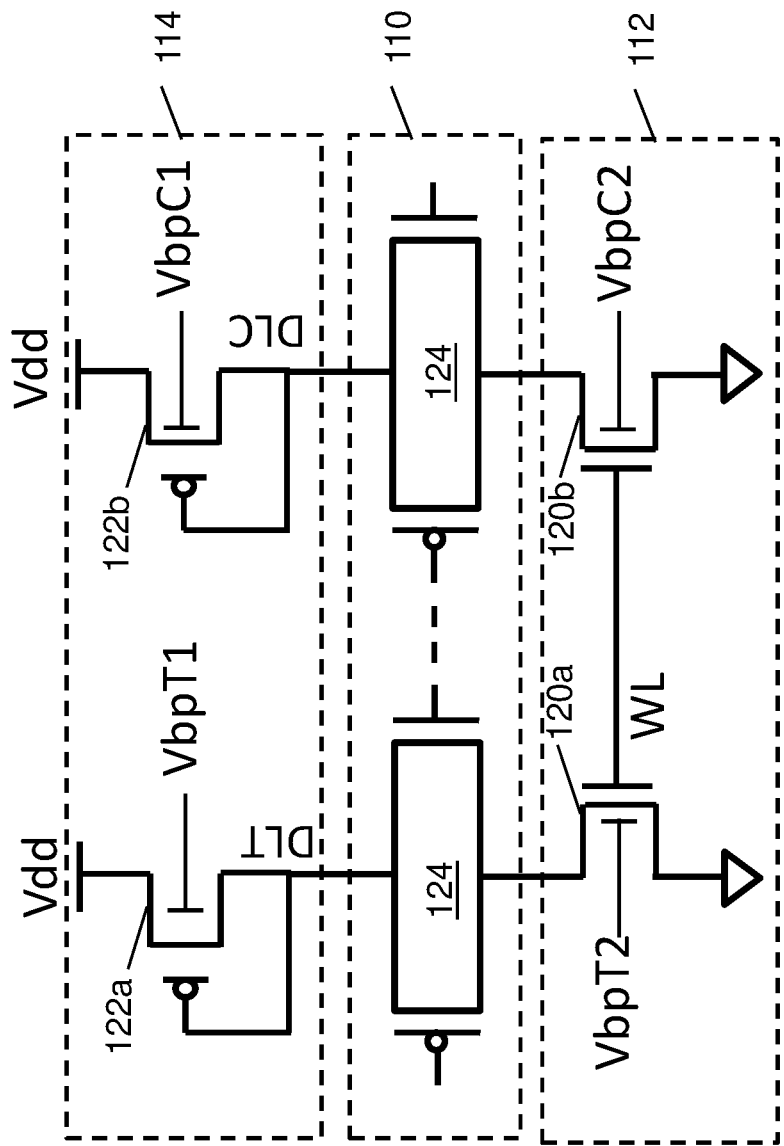
FIG. 4 shows an expanded schematic view of a structure according to still further embodiments of the disclosure.

Turning to FIG. 4, further implementations of the disclosure may combine various aspects of other implementation to further control the threshold voltage margin between memory transistors 120a, 120b. Specifically, FIG. 4 depicts an implementation where bias voltage source 116 (FIG. 1) transmits a first pair of biasing voltages VbpT1, VbpC1 to diode-connected transistors 122a, 122b and transmits a second pair of biasing voltages VbpT2, VbpC2 to memory transistors 120a, 120b. Each of the four biasing voltages VbpT1, VbpC2, VbpT2, VbpC2 may be of a different magnitude, such that bias voltage source 116, and control circuit 118 (FIG. 1) where applicable, can finely adjust the threshold voltage margin for memory transistors 120 (e.g., for greater filtering of unstable cells). It is emphasized that the body biasing of two pairs of transistors (i.e., memory transistors 120a, 120b and diode-connected transistors 122a, 122b) is not required for filtering of unstable (i.e., lower threshold voltage margin) pairs of transistors 120 when reading data from memory cells 112 but may provide greater control over selecting the minimum threshold voltage margin in some situations.

Figure 5:
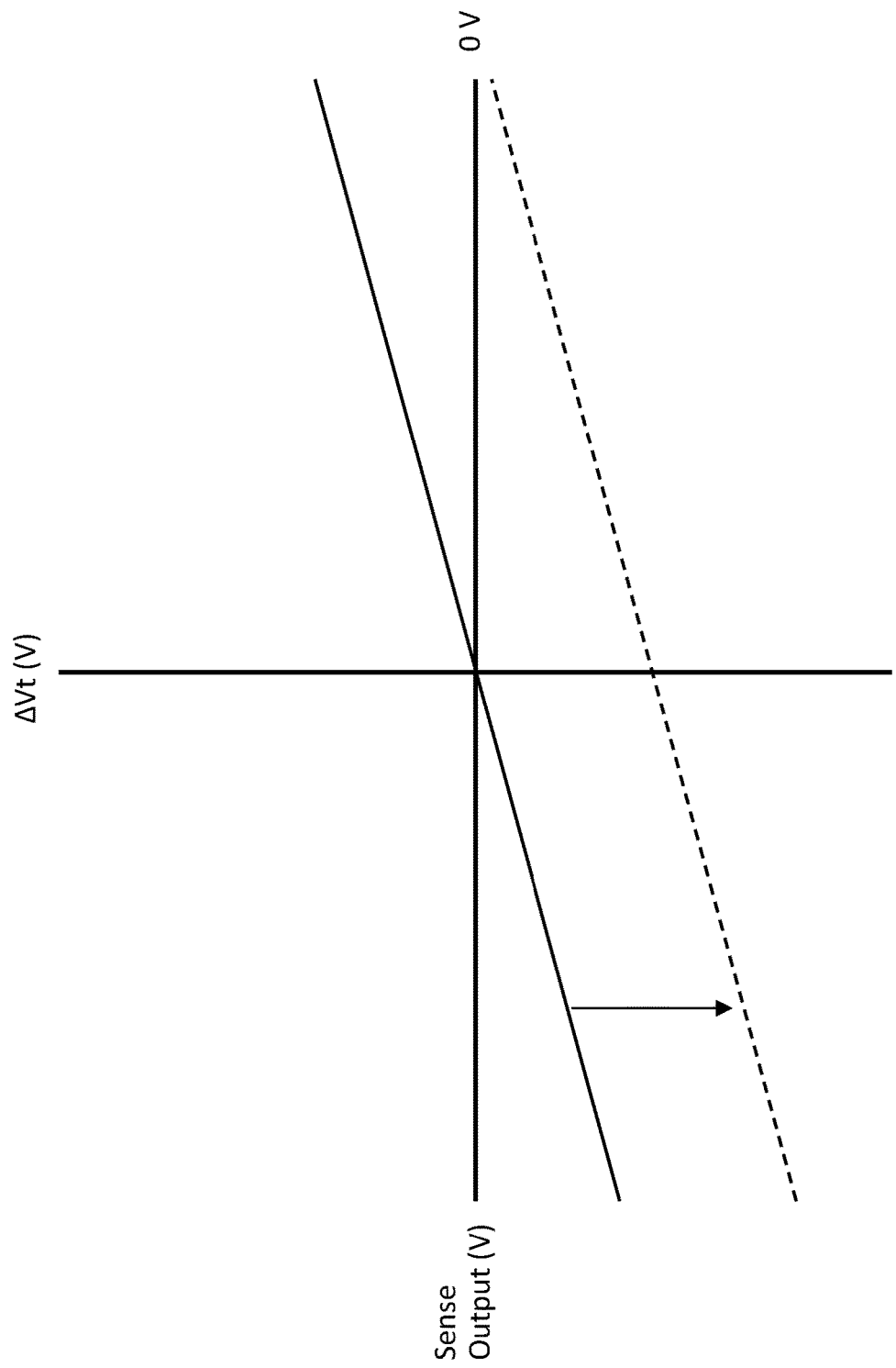
FIG. 5 shows a comparative plot of threshold voltage margin relative to sensing circuit output for different bias voltages according to embodiments of the disclosure.
Figure 6:
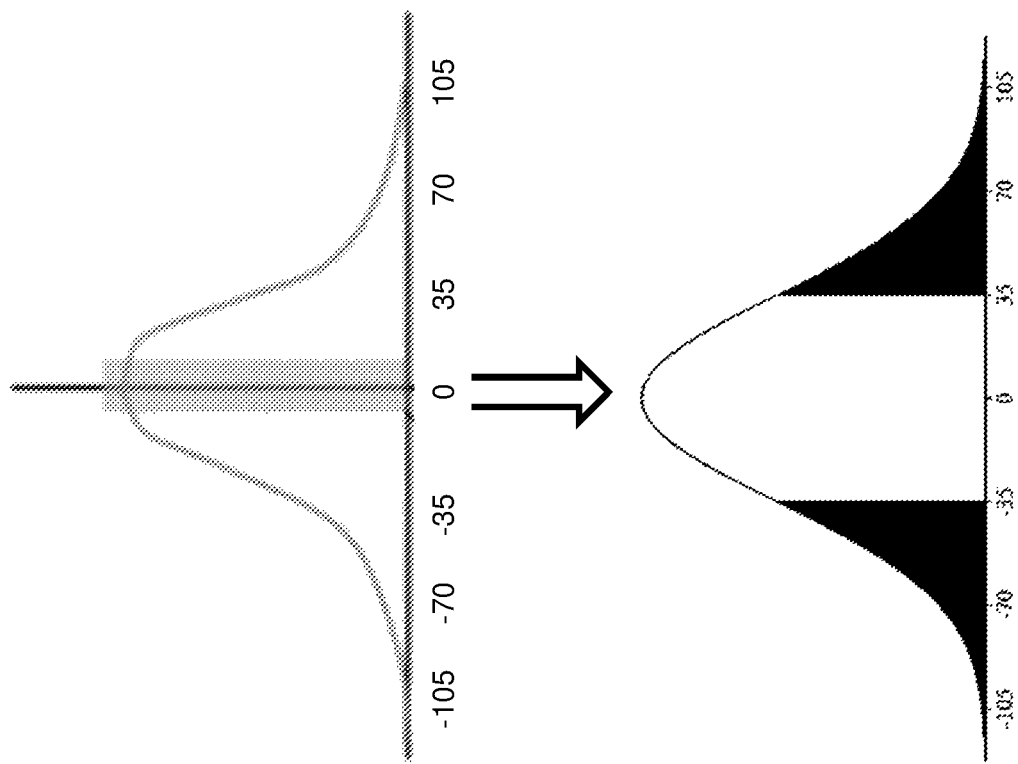
FIG. 6 shows a comparative plot of memory cell readings with and without biasing according to embodiments of the disclosure.

Referring to FIGS. 1, 5, and 6 together, the operational effects of structure 100 in various implementations are discussed in more detail. FIG. 5 provides a comparative plot of threshold voltage margin versus sensing circuit 114 output ("OUTPUT") voltage for memory array 106 without body biasing (solid line), compared with the same plot for memory array 106 with body biasing (dashed line) via bias voltage source 116. FIG. 6 provides a first histogram of memory states read from memory array 106 without body biasing, compared with a second histogram of memory states read from memory array 106 with body biasing. In this example, the minimum threshold voltage margin indicating the boundary between one memory state and another is zero volts, although this value may be different in other implementations.

In the example without body biasing, sensing circuit 114 detects a majority of memory states as being close to the minimum threshold voltage margin, i.e., a majority of detected threshold voltage margins are close to zero volts. In FIG. 6, shaded portions of each histogram indicate responses detected in sensing circuit 114. Without body biasing, a significant number of detected voltages are indeterminate (i.e., as indicated by the number of responses that have a threshold voltage margin of approximately zero). FIG. 5 demonstrates that body biasing of memory transistors 120a, 120b (FIGS. 2-4) and/or diode-connected transistors 122a, 122b (FIGS. 2-4) will substantially retain the linearity of voltage outputs from sensing circuit 114 but will translate the position of the curve relative to the minimum threshold voltage margin (i.e., zero V in this example). Now, a majority the detected threshold voltage margins are not near the minimum threshold voltage margin, and hence the memory state in each set of memory transistors 120a, 120b is more easily detectable. As indicated in FIG. 6, applying the bias voltage to memory transistors 120a, 120b (FIGS. 2-4) and/or diode-connected transistors 122a, 122b converts the histogram into a bimodal distribution, in which substantially no memory cells 112 are detected as having a threshold voltage margin at or near zero. Thus, embodiments of the disclosure are operable to filter out lower threshold voltage margin pairs of memory transistors 120a, 120b, from a group of memory cells 112 being read.

Figure 7:
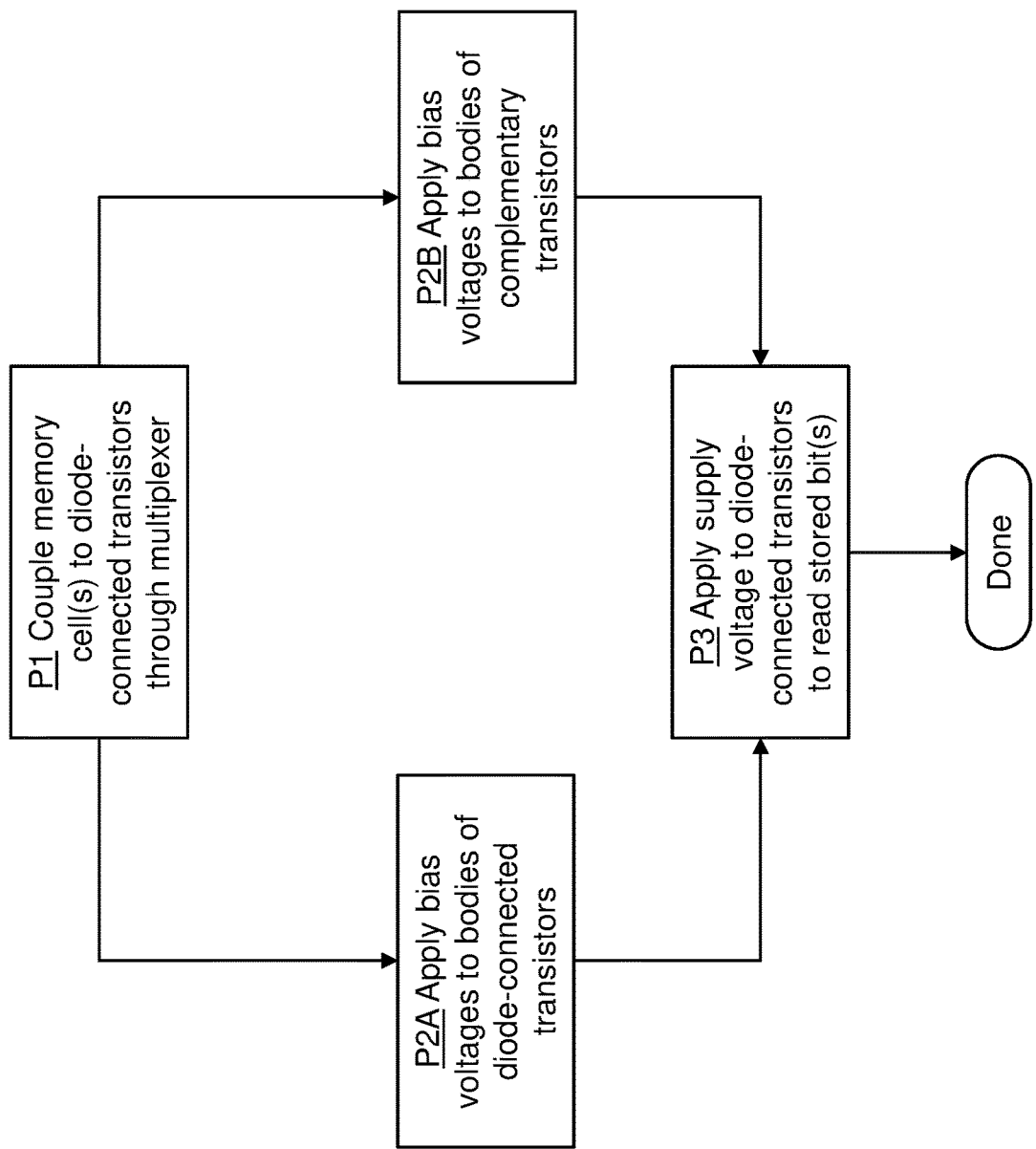
FIG. 7 shows an illustrative flow diagram of an operational methodology according to embodiments of the disclosure.

Referring to FIGS. 1 and 7 together, further embodiments of the disclosure provide operational methodologies to read data from memory array 106, while using body biasing as discussed herein to filter out lower threshold voltage margin pairs of memory transistors 120a, 120b (FIGS. 2-4) from being read. As discussed elsewhere herein, memory array 106 may include memory cells 112 in the form of a physically unclonable function (PUF) memory structure, flash memory structure, and/or any other type of memory structure to be read. Methods of the disclosure may be implemented according to any embodiment of structure 100 discussed herein, and/or other circuit architectures suitable for body biasing of transistors within memory cell(s) 112 and/or sensing circuit(s) 114. As noted herein, sensing circuit 114 may be included within or coupled to amplifier 115. Thus, any operations performed via sensing circuit 114 may include operating a sense amplifier including sensing circuit 114 and/or amplifier 115 therein. In process P1, structure 100 and/or an operator thereof may couple one or more memory cells 112 to a corresponding sensing circuit 114, e.g., by using multiplexer 110 to select memory cells 112 with data to be read. Multiplexer 110 may operate based on inputs provided by a user and/or internal logic for automatically selecting a set of memory cells 112 to undergo a reading operation. After memory cell(s) 112 is/are coupled to sensing circuit(s) 114, the data stored within selected memory cells 112 can be read. Further processing may include implementing one or both of processes P2A, P2B for body biasing of transistors within memory cell 112 (i.e., memory transistors 120a 120b (FIGS. 2-4)) or other transistors coupled thereto (i.e., diode-connected transistors 122a, 122b).

Process P2A may include, e.g., applying different bias voltages VbpT, VbpC to the body of each diode-connected transistor 122a, 122b of sensing circuit(s) 114 coupled to memory cell 112 through multiplexer 110. Biasing the body of each diode-connected transistor 122a, 122b can affect whether voltage levels corresponding to a non-volatile memory may be detected in sensing circuit 114. This filtering of memory levels may arise by controlling the threshold voltage margin through the bias voltage applied to diode-connected transistors 122a, 122b. In addition, or alternatively, methods of the disclosure may include process P2B of applying different bias voltages VbpT, VbpC to each body of memory transistors 120a, 120b. Applying the bias voltages VbpT, VbpC in process P2B may directly influence the threshold voltage margin between memory transistors 120a, 120b, and hence may directly control which memory states in memory cells 112 are detectable with sensing circuit 114. In further embodiments, and as discussed elsewhere herein, it is possible to implement process P2A, P2B together (i.e., apply four bias voltages VbpT1, VbpC1, VbpT2, VbpC2) to further control the threshold voltage margin between memory transistors 120a, 120b. Regardless of whether one or both of processes P2A, P2B are implemented the body biasing may include electrically biasing the body (e.g., bulk substrate) of a planar transistor or electrically biasing the back gate (e.g., substrate beneath insulator) of an SOI transistor structure. Where multiplexer 110 selects multiple memory cells 112 for reading, each memory cell 112 and/or corresponding sensing circuit 114 may electrically bias the body of memory transistor(s) 120a, 120b and/or diode-connected transistors 122a, 122b with the distinct biasing voltages VbpT, VbpC.

Continued operations of the disclosure may be implemented during the applying of bias voltages in process P2A and/or P2B. While applying the bias voltages, methods of the disclosure may include process P3 of applying supply voltage Vdd to diode-connected transistors 122a, 122b. Applying supply voltage Vdd to diode-connected transistors 122a, 122b of sensing circuit 114 may initiate reading of a stored bit from memory transistors 120a, 120b of memory cell 112. As discussed herein, the simultaneous body biasing of memory transistors 120a, 120b and diode-connected transistors 122a, 122b will filter out lower threshold voltage margin pairs of memory transistors 120a, 120b and reduce the number of indeterminate bits detected within memory cells 112.

Embodiments of the disclosure provide various technical and commercial advantages, examples of which are discussed herein. Structure 100 enables sensing of threshold voltage margins that are not close to the minimum threshold voltage margin, e.g., by electrically biasing the threshold voltage of a memory cell's transistors away from indeterminate values. Moreover, the components for electrically biasing memory cells 112 and/or sensing circuits 114 may be implemented via relatively simple components (e.g., biasing voltage source 116 in the form of a voltage divider, and optional control circuit 118 therefor), thus reducing the consumption of surface area and power compared to other structures for filtering indeterminate bits from memory. In addition, embodiments of the disclosure may effectively perform the same functions as a voltage adder and/or subtractor without the additional transistors conventionally needed to perform such functions.

Aspects of the present disclosure are described above with reference to flowchart illustrations and/or block diagrams of methods and apparatus (systems) according to embodiments of the disclosure. It will be understood that each block of the flowchart illustrations and/or block diagrams, and combinations of blocks in the flowchart illustrations and/or block diagrams, can be implemented by hardware and/or software (e.g., computer program instructions). Where implemented with the aid of computer program instructions, such instructions for implementing methods of the disclosure may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a memory cell having a pair of memory transistors each having a gate coupled to a word line;
   a pair of diode-connected transistors each having a source/drain (S/D) terminal coupled to a respective S/D terminal of one of the pair of memory transistors through a multiplexer; and
   a bias voltage source coupled to each body of the pair of diode-connected transistors, wherein the bias voltage source applies a different bias voltage to each body of the pair of diode-connected transistors.

2. The structure of claim 1, further comprising a control circuit coupled to the bias voltage source and configured to modify a threshold voltage margin of the pair of diode-connected transistors by adjusting the different bias voltage applied to each body of the pair of diode-connected transistors.

3. The structure of claim 2, wherein the control circuit adjusts the different bias voltage applied to each body of the pair of diode-connected transistors to filter out lower memory cells having a threshold voltage margin lower than a minimum threshold voltage margin.

4. The structure of claim 1, wherein the pair of diode-connected transistors are included within a sense amplifier for reading data from the pair of memory transistors of the memory cell.

5. The structure of claim 1, wherein the memory cell is included within one of a physically unclonable function (PUF) memory structure or a flash memory structure.

6. The structure of claim 1, wherein each of the pair of diode-connected transistors includes one of:
   a pair of planar transistors on a bulk semiconductor; or
   a pair of semiconductor on insulator (SOI) transistors, wherein the body of each SOI transistor includes a back gate terminal.

7. The structure of claim 1, wherein the bias voltage source is further coupled to each body terminal of the pair of memory transistors of the memory cell, wherein the bias voltage source further applies different bias voltages to each body terminal of the pair of memory transistors.

8. A structure comprising:
   a memory cell having a pair of memory transistors each having a gate coupled to a word line;
   a pair of diode-connected transistors each having a source/drain (S/D) terminal coupled to a respective S/D terminal of one of the pair of memory transistors through a multiplexer; and
   a bias voltage source coupled to each body of the pair of memory transistors, wherein the bias voltage source applies a different bias voltage to each body of the pair of memory transistors.

9. The structure of claim 8, further comprising a control circuit coupled to the bias voltage source and configured to modify a threshold voltage margin of the pair of memory transistors by adjusting the different bias voltage applied to each body of the pair of memory transistors.

10. The structure of claim 9, wherein the control circuit adjusts the different bias voltage applied to each body of the pair of memory transistors to filter out lower memory cells having a threshold voltage margin lower than a minimum threshold voltage margin.

11. The structure of claim 8, wherein the pair of diode-connected transistors are included within a sense amplifier for reading data from the pair of memory transistors of the memory cell.

12. The structure of claim 8, wherein the memory cell is included within one of a physically unclonable function (PUF) memory structure or a flash memory structure.

13. The structure of claim 8, wherein each of the pair of memory transistors includes one of:
   a pair of planar transistors on a bulk semiconductor; or
   a pair of semiconductor on insulator (SOI) transistors, wherein the body of each SOI transistor includes a back gate terminal.

14. The structure of claim 8, wherein the bias voltage source is further coupled to each body terminal of the pair of diode-connected transistors, wherein the bias voltage source further applies different bias voltages to each body terminal of the pair of diode-connected transistors.

15. A method comprising:
   coupling each of a pair of memory transistors of a memory cell to a respective one of a pair of diode-connected transistors through a multiplexer;
   applying a different bias voltage to each body of the pair of diode-connected transistors or the pair of memory transistors to adjust a threshold voltage margin of the pair of memory transistors; and applying a supply voltage to the pair of diode-connected transistors, while applying the different bias voltage, to read a stored bit from the pair of memory transistors and filter out lower memory cells having a threshold voltage margin lower than a minimum threshold voltage margin.

16. The method of claim 15, further comprising applying the different bias voltage to each body of the pair of diode-connected transistors and the pair of memory transistors to further adjust the threshold voltage margin of the pair of memory transistors.

17. The method of claim 15, wherein the memory cell includes one of a plurality of memory cells each having a respective pair of memory transistors, and further including applying the different bias voltages to each body within each of the plurality of memory cells.

18. The method of claim 17, wherein applying the different bias voltage to each body of the pair of diode-connected transistors or the pair of memory transistors includes biasing a pair of back gate terminals within a pair of semiconductor on insulator (SOI) transistors of the pair of diode-connected transistors or the pair of memory transistors.

19. The method of claim 15, wherein transmitting the supply voltage to the pair of diode-connected transistors includes operating a sense amplifier for reading data from the pair of memory transistors of the memory cell.

20. The method of claim 15, wherein the memory cell is included within one of a physically unclonable function (PUF) memory structure or a flash memory structure.

* * * * *